US012733407B2

(12) United States Patent
Yamaji et al.

(10) Patent No.: US 12,733,407 B2
(45) Date of Patent: Sep. 8, 2026

(54) CIRCUIT MANUFACTURING METHOD AND SUPERCONDUCTING CIRCUIT

(71) Applicant: NEC Corporation, Tokyo (JP)

(72) Inventors: Tomohiro Yamaji, Tokyo (JP); Tsuyoshi Yamamoto, Tokyo (JP)

(73) Assignee: NEC CORPORATION, Tokyo (JP)

( * ) Notice: Subject to any disclaimer, the term of this patent is extended or adjusted under 35 U.S.C. 154(b) by 1264 days.

(21) Appl. No.: 17/619,381

(22) PCT Filed: Mar. 16, 2020

(86) PCT No.: PCT/JP2020/011387
§ 371 (c)(1),
(2) Date: Dec. 15, 2021

(87) PCT Pub. No.: WO2020/261667
PCT Pub. Date: Dec. 30, 2020

(65) Prior Publication Data

US 2022/0231216 A1 Jul. 21, 2022

(30) Foreign Application Priority Data

Jun. 28, 2019 (JP) ................................ 2019-121065

(51) Int. Cl.
*H10N 60/01* (2023.01)
*H10N 60/12* (2023.01)
(Continued)

(52) U.S. Cl.
CPC ..... *H10N 60/0381* (2023.02); *H10N 60/0912* (2023.02); *H10N 60/12* (2023.02); *H10N 60/805* (2023.02); *H10N 69/00* (2023.02)

(58) Field of Classification Search
CPC ... H10N 60/0381; H10N 60/12; H10N 60/805
See application file for complete search history.

(56) References Cited

U.S. PATENT DOCUMENTS 4,218,532 A 8/1980 Dunkleberger
5,753,935 A 5/1998 Kurakado et al.
(Continued)

FOREIGN PATENT DOCUMENTS

JP S63-318176 A 12/1988
JP H03-274772 A 12/1991
JP 2017-73106 A 4/2017

OTHER PUBLICATIONS

International Search Report for PCT Application No. PCT/JP2020/011387, mailed on Jun. 9, 2020.
(Continued)

*Primary Examiner* — Paul A Wartalowicz
(74) *Attorney, Agent, or Firm* — Sughrue Mion, PLLC

(57) ABSTRACT

A circuit manufacturing method according to the present disclosure is a circuit manufacturing method by deposition, comprising performing first deposition for forming a first superconductor layer, oxidizing a surface of the first superconductor layer to form an oxide film, performing second deposition for forming a second superconductor layer, whereby a circuit in which Josephson junctions are aligned is generated. A mask includes two opening parts and an odd number of first-type opening parts. The width of a first-type opening part has such a length that the area of a Josephson junction formed based on the first superconductor layer and the second superconductor layer derived from the first-type opening part becomes larger than the area of a Josephson junction formed based on the first superconductor layer and the second superconductor layer derived from the two opening parts that are adjacent to each other.

3 Claims, 11 Drawing Sheets

(51) Int. Cl.
*H10N 60/80* (2023.01)
*H10N 69/00* (2023.01)

(56) References Cited

U.S. PATENT DOCUMENTS

| | | | | |
|---|---|---|---|---|
| 2007/0281861 | A1* | 12/2007 | Ishimaru | H10N 60/124 505/100 |
| 2015/0119252 | A1* | 4/2015 | Ladizinsky | H01L 21/76877 505/410 |
| 2016/0093790 | A1* | 3/2016 | Rigetti | H10N 60/0912 257/31 |
| 2018/0138389 | A1* | 5/2018 | Kirby | H10N 60/0156 |
| 2019/0137891 | A1 | 5/2019 | Brink et al. | |

OTHER PUBLICATIONS

C. Eichler et al., “Controlling the dynamic range of a Josephson parametric amplifier”, EPJ Quantum Technology 2014, 1:2, URL <http://www.epjquantumtechnology.com/content/1/1/2>, pp. 1-19.
V. E. Manucharyan et al., “Fluxonium: Single Cooper-Pair Circuit Free of Charge Offsets”, Science, vol. 326, Oct. 2, 2009, Downloaded from <http://science.sciencemag.org/> on Mar. 4, 2019, pp. 113-116.

* cited by examiner

CIRCUIT MANUFACTURING METHOD AND SUPERCONDUCTING CIRCUIT

This application is a National Stage Entry of PCT/JP2020/011387 filed on Mar. 16, 2020, which claims priority from Japanese Patent Application 2019-121065 filed on Jun. 28, 2019, the contents of all of which are incorporated herein by reference, in their entirety.

TECHNICAL FIELD

The present invention relates to a circuit manufacturing method and a superconducting circuit, and in particular, to a method of manufacturing a superconducting circuit.

BACKGROUND ART

It is possible that quantum computers, which perform calculations based on the principles of quantum mechanics, may be able to solve specific problems faster than classical computers do, and it is thus expected that quantum computers will be applied to optimization problems and Artificial Intelligence (AI). The computational power required to solve problems in modern society that have become complicated and difficult to tackle has been increasing, and it is thus expected that quantum computing technology that complements classical computers will become more and more important.

In view of the aforementioned circumstances, a quantum computer that uses a non-linear oscillator has been proposed with the aim of applying it to quantum annealing, which is a kind of quantum computation (Patent Literature 1). This Patent Literature discloses a configuration using a distributed constant-type Josephson parametric oscillator as a non-linear oscillator. A Josephson parametric oscillator is generally formed of a superconducting quantum interference device formed of a coplanar waveguide and Josephson junctions obtained by depositing a superconductor on a semiconductor wafer. When microwaves with a sufficient intensity having a frequency two times a resonant frequency of the oscillator circuit are input to the superconducting quantum interference device, parametric oscillation occurs and output waves of the resonant frequency are obtained from an input/output port. The phase of the output waves is either in phase with or opposite to the phase of the input microwaves. The phase of the output waves corresponds to bit (0,1) in the quantum computation.

While it is required that an oscillator used as a quantum computer have nonlinearity (Kerr nonlinearity or a K value) of an appropriate level (about 10 MHz), this value is smaller than the K value of a general quantum bit (about 100 MHz) by about one order of magnitude. The K value representing the nonlinearity is a value defined by a coefficient of a nonlinear term of a Hamiltonian of an oscillator. As a method of adjusting the K value to an appropriate value, it has been proposed to use a superconducting quantum interference device formed of an array of Josephson junctions aligned in series, as disclosed in Non-Patent Literature 1. By using a superconducting quantum interference device formed of an array including J Josephson junctions, the K value can be reduced in inverse proportion to $J^2$.

A double-angle shadow evaporation (an oblique deposition method) has been generally used as a method of manufacturing a superconducting quantum interference device. According to the double-angle shadow evaporation, a superconductor is obliquely deposited twice through a mask when it is deposited. The surface of the first-layer superconductor formed by the first deposition is oxidized to cause its surface to be an insulator, and then a second-layer superconductor is deposited thereon, whereby a Josephson junction is generated. Non-Patent Literature 2 reports a superconducting circuit having a structure including 43 Josephson junctions aligned in series, the superconducting circuit being manufactured by a double-angle shadow evaporation. This structure is obtained by a mask in which opening parts having a fixed size are aligned on a line at equal intervals.

CITATION LIST

Patent Literature

[Patent Literature 1] Japanese Unexamined Patent Application Publication No. 2017-73106

Non Patent Literature

[Non Patent Literature 1] C. Eichler and A. Wallraff. "Controlling the dynamic range of a Josephson parametric amplifier", EPJ Quantum Technology 2014, 1:2.

[Non Patent Literature 2] V. E. Manucharyan. et. al. "Fluxonium: Single Cooper-Pair Circuit Free of Charge Offsets", Science, 2009

SUMMARY OF INVENTION

Technical Problem

When a double-angle shadow evaporation using a mask including opening parts having a fixed size aligned on a line at equal intervals is performed, there is a problem that the number of Josephson junctions becomes an odd number. While this does not cause a serious problem when a large number of (43) Josephson junctions are coupled to each other as disclosed in Non-Patent Literature 2, the following problem occurs when the K value of the superconducting quantum circuit is adjusted. The K value of a general superconducting quantum interference device, that is, a superconducting quantum interference device, which is a circuit that forms one loop by two Josephson junctions, is used is denoted by $K_0$. The K value when a superconducting quantum interference device formed of an array including J junctions is used becomes $K_0/J^2$ since the K value is in proportion to $J \times E \times P^4$. The symbol E, which is Josephson energy per Josephson junction, is in proportion to J. Further, P, which is a phase per junction, is in proportion to $J^{-1}$. While the K value of a quantum bit called a transmon type is about 100 MHz, the K value of a quantum computation circuit assumed in Patent Literature 1 is about 10 MHz. Therefore, the number of Josephson junctions is suitably several. Therefore, in the manufacturing method in which an array having only an odd number of Josephson junctions can be manufactured, the K value cannot be appropriately adjusted. Further, when the number of Josephson junctions in the array is as small as two or four, the stability of the resonator (oscillator) is relatively high. However, when the number of Josephson junctions in an array becomes large, the phase of the Josephson junction is shifted, which induces oscillation modes other than the resonant frequency used for operations of an oscillator. Therefore, the resonator (oscillator) becomes unstable.

The aim of the present disclosure is to provide a circuit in which a substantially even number of Josephson junctions are aligned in series.

Solution to Problem

A circuit manufacturing method according to a first aspect is a circuit manufacturing method by deposition, including:

performing first deposition for forming a first superconductor layer by depositing a superconductor on a substrate through a mask in a first direction;

oxidizing a surface of the first superconductor layer, thereby forming an oxide film;

performing second deposition for forming a second superconductor layer by depositing the superconductor on the substrate through the mask in a second direction, the first superconductor layer and the oxide film being formed in the substrate; and generating a circuit in which Josephson junctions are aligned, each of the Josephson junctions including the first superconductor layer and the second superconductor layer that overlap each other via the oxide film, in which the mask includes two opening parts provided at the respective ends of the mask and an odd number of first-type opening parts provided on a line segment that connects the two opening parts, the odd number of first-type opening parts being provided between the two opening parts, the first direction is a direction that is inclined in a first orientation with respect to a normal line with respect to the mask on a plane defined by the line segment and the normal line with respect to the mask, the second direction is a direction that is inclined in a second orientation opposite to the first orientation with respect to the normal line on the plane, and the width of the first-type opening part in the direction in which the line segment is extended has such a length that the area of a Josephson junction formed based on the first superconductor layer and the second superconductor layer derived from the first-type opening part becomes larger than the area of a Josephson junction formed based on the first superconductor layer and the second superconductor layer derived from the two opening parts that are adjacent to each other.

Further, a superconducting circuit according to a second aspect includes:

a substrate;

first superconductor layers arranged on the substrate in a line shape in a predetermined direction with a predetermined gap therebetween, a surface of each of the first superconductor layers being covered with an oxide film;

second superconductor layers arranged on the substrate and the first superconductor layers in a line shape in the predetermined direction with the predetermined gap therebetween, the pattern in which the second superconductor layers are arranged being displaced from the pattern in which the first superconductor layers are arranged, in which of a plurality of Josephson junctions, which indicate parts where the first superconductor layers and the second superconductor layers overlap each other via the oxide film, Josephson junctions except for the Josephson junctions at the respective ends of the substrate include first-type Josephson junctions and second-type Josephson junctions, the area of the first-type Josephson junctions is larger than the area of the second-type Josephson junctions, and the number of first-type Josephson junctions is an odd number and the total number of first-type Josephson junctions and second-type Josephson junctions is an odd number as well.

Advantageous Effects of Invention

According to the aforementioned aspects, it is possible to provide a circuit in which a substantially even number of Josephson junctions are aligned in series.

EXAMPLE EMBODIMENTS

Figure 1:
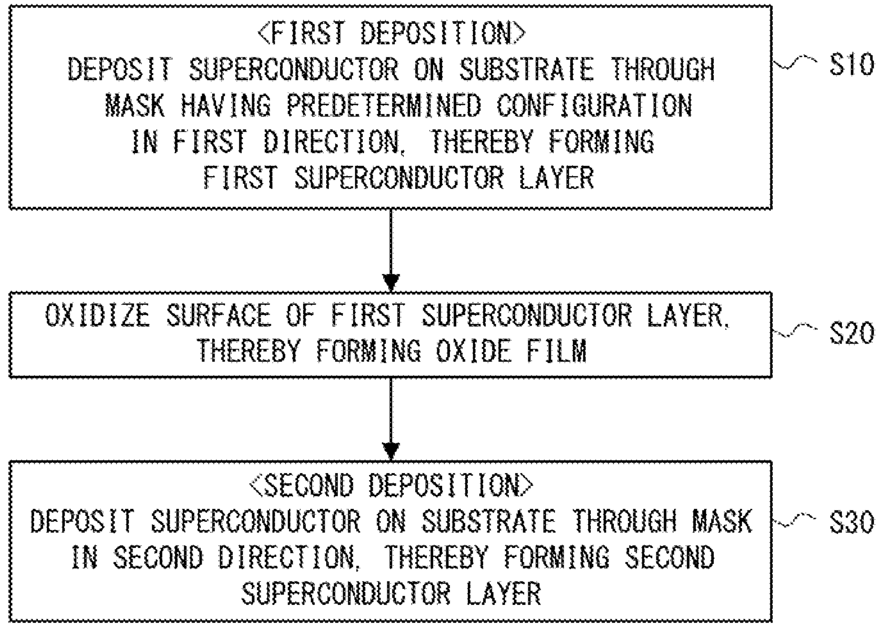
FIG. 1 is a flowchart showing a flow of a circuit manufacturing method according to an example embodiment.

FIG. 1 is a flowchart showing a flow of a circuit manufacturing method according to an example embodiment. The circuit manufacturing method according to this example embodiment, which is a circuit manufacturing method by a double-angle shadow evaporation, manufactures a first superconductor layer by a first deposition treatment and manufactures a second superconductor layer by a second deposition treatment. Note that the double-angle shadow evaporation is a deposition method in which a deposition material is moved through a mask in an oblique direction with respect to a surface of a substrate. Specifically, a double-angle shadow evaporation apparatus performs processing including the following steps.

First, in Step S10, the first deposition treatment is carried out. Specifically, a superconductor is deposited on a substrate through a mask having a predetermined configuration in a first direction, whereby a first superconductor layer is formed. The mask having a predetermined configuration includes two opening parts provided at the respective ends of the mask and one first-type opening part that is provided on a line segment that connects the two opening parts, the first-type opening part being provided between the two opening parts. Note that this mask may further include one or more second-type opening parts on the line segment that connects the two opening parts that are provided at the respective ends of the mask, the one or more second-type opening parts being provided between the two opening parts. The second-type opening part is an opening part whose width in the direction in which the above line segment is extended is shorter than that of the first-type opening part. Therefore, the mask can also be explained as follows. The mask includes opening parts provided at the respective ends of the mask and N (N is an integer equal to or larger than 1) opening parts provided between the two opening parts. Of the N opening parts, one opening part is the first-type opening part and the remaining (N−1) opening parts are the second-type opening parts. When N=1, this means that the mask does not include second-type opening parts.

Further, the width of the first-type opening part in the direction in which the line segment is extended has the following size when the mask does not include second-type opening parts. That is, this width has such a length that the area of a Josephson junction by the first-type opening part becomes larger than the area of a Josephson junction by opening parts adjacent to each other. The Josephson junction by the first-type opening part means a Josephson junction that is formed based on the first superconductor layer and the second superconductor layer derived from one first-type opening part. That is, the Josephson junction by the first-type opening part means a Josephson junction that is formed by a superconductor deposited through one first-type opening part in the first deposition and a superconductor deposited through the same first-type opening part in the second deposition. Further, the Josephson junction by the opening parts adjacent to each other means a Josephson junction formed based on the first superconductor layer and the second superconductor layer derived from two opening parts that are adjacent to each other and are provided in the mask. That is, the Josephson junction by the opening parts adjacent to each other means a Josephson unction that is formed by a superconductor deposited through one opening part in the first deposition, and a superconductor deposited through an opening part that is adjacent to the above opening part in the second deposition.

Further, when the mask includes the second-type opening part, the width of the first-type opening part in the direction in which the line segment is extended has the following size. That is, this width has such a length that the area of a Josephson junction by the first-type opening part becomes larger than the area of a Josephson junction by the opening parts adjacent to each other and the area of a Josephson junction by the second-type opening part. The Josephson junction by the second-type opening part means a Josephson junction that is formed based on the first superconductor layer and the second superconductor layer derived from one second-type opening part. That is, the Josephson junction by the second-type opening part means a Josephson junction that is formed of a superconductor deposited through one second-type opening part in the first deposition and a superconductor deposited through the same second-type opening part in the second deposition.

Note that, in the following description, a Josephson junction that is formed based on the first superconductor layer and the second superconductor layer derived from one opening part may be referred to as a Josephson junction based on a superconductor derived from an opening part.

Next, in Step S20, the surface of the first superconductor layer is oxidized in an oxygen atmosphere, thereby forming an oxide film on this surface. Accordingly, a film of an insulator is formed on the surface of the first superconductor layer.

Next, in Step S30, the second deposition treatment is carried out. Specifically, a superconductor is deposited on the substrate in which the first superconductor layer and the oxide film are formed in the second direction through the aforementioned mask, whereby the second superconductor layer is formed. Since the oxide film generated in Step S20 functions as an insulation film, as a result of processing from Step S10 to Step S30, a structure in which the first superconductor layer and the second superconductor layer overlap each other via the oxide film (the insulation film) is generated. That is, a Josephson junction formed of the first superconductor layer and the second superconductor layer that overlap each other via the oxide film (insulation film) is generated. Further, a plurality of Josephson junctions are generated by processing of the steps described above and they are aligned on the substrate along the aforementioned line segment. In this way, as a result of processing from Step S10 to Step S30, a circuit in which Josephson junctions are aligned along the aforementioned line segment (circuit in which Josephson junctions are connected in series) is generated.

Figure 2:
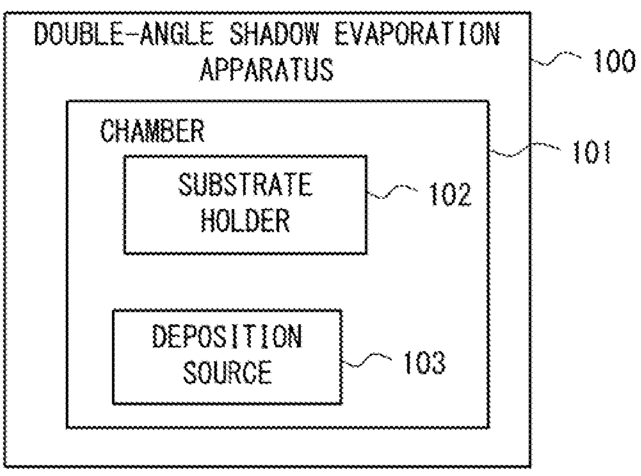
FIG. 2 is a block diagram showing one example of a configuration of a double-angle shadow evaporation apparatus.

The flowchart shown in FIG. 1 can be executed using a general double-angle shadow evaporation apparatus. For example, as shown in FIG. 2, a double-angle shadow evaporation apparatus 100 including a chamber 101, a substrate holder 102 that is provided in the chamber 101 and holds the substrate, and a deposition source 103 that is provided in the chamber and generates vapor of a superconductor, which is a deposition material, can be used. While the inside of the chamber 101 is vacuum in Steps S10 and S30, the chamber 101 is filled with oxygen in Step S20. While Nb (niobium) or Al (aluminum) is used, for example, as the deposition material, that is, a superconductor to be deposited, it may be any other metal such as Mo (molybdenum) or Ta (tantalum) that is in a superconducting state when it is cooled down to an extremely low temperature.

Figure 3A:
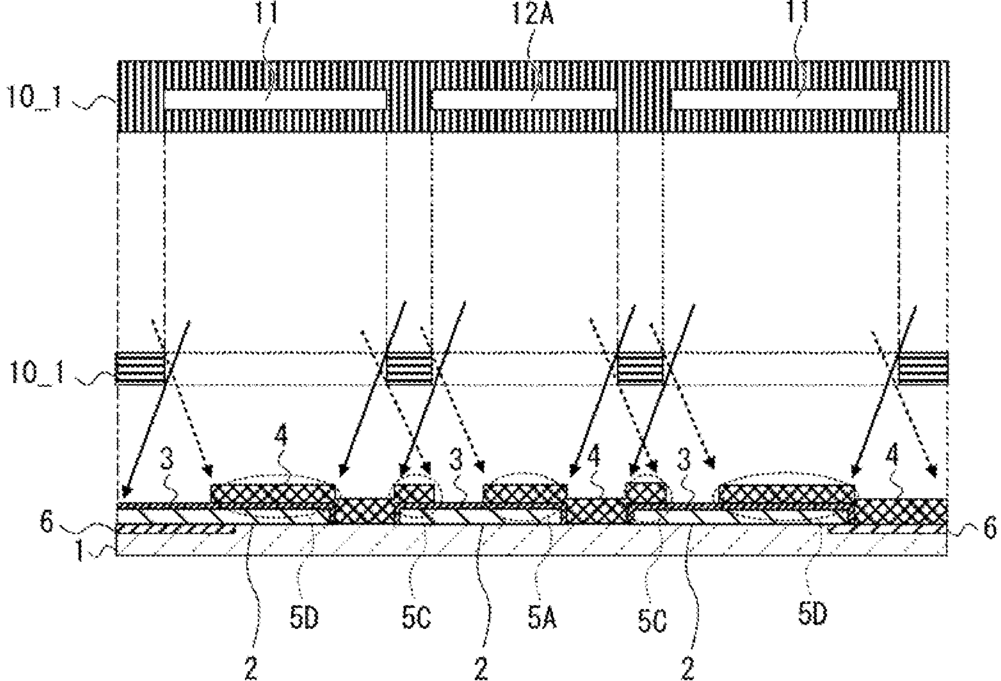
FIG. 3A is a schematic view showing a circuit manufacturing method when a mask does not include a second-type opening part (when N=1)
Figure 3B:
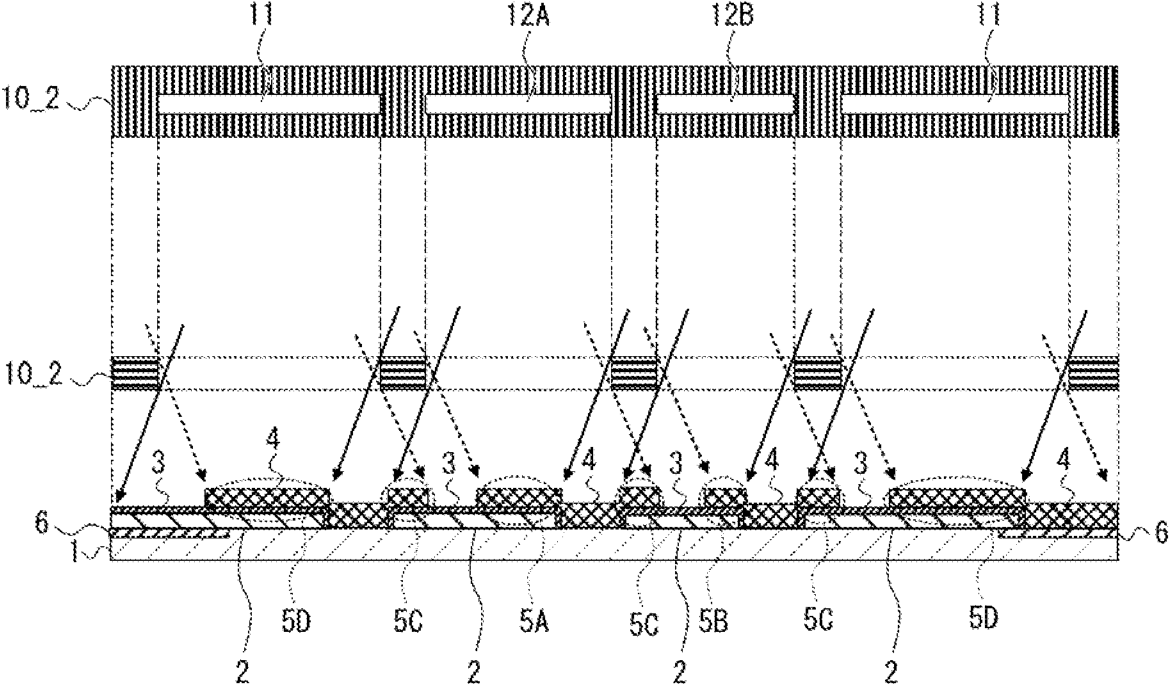
FIG. 3B is a schematic view showing a circuit manufacturing method when the mask includes a second-type opening part (when N>1)

FIGS. 3A and 3B are schematic views showing a circuit manufacturing method according to the example embodiment. FIG. 3A is a schematic view showing a circuit manufacturing method when the aforementioned mask (a mask 10_1) does not include the second-type opening part (when N=1). On the other hand, FIG. 3B is a schematic view showing a circuit manufacturing method when the aforementioned mask (a mask 10_2) includes the second-type opening part (when N>1). More specifically, FIG. 3B shows a case in which the mask 10_2 including one first-type opening part and one second-type opening part is used (when N=2) as one example. While FIG. 3B shows a case in which N=2 as one example, N may be three or larger. In the following description, when the mask 10_1 and the mask 10_2 are not specifically distinguished from each other, they are simply referred to as a mask 10. In each of FIGS. 3A and 3B, the upper stage shows a plan view of the mask 10 (when the structure of the mask 10 is seen from the vertical upper side) and the lower stage shows a cross-sectional view of the mask 10 and the substrate 1 in order to facilitate understanding. Hereinafter, with reference to FIGS. 3A and 3B, the structure of the mask 10 and circuits generated by the aforementioned circuit manufacturing method will be specifically described.

As shown in FIGS. 3A and 3B, the mask 10 includes a plurality of rectangular opening parts aligned in a line. Specifically, the mask 10 includes two opening parts 11 provided at the respective ends of the mask 10, and N opening parts that are provided on the line segment that connects the two opening parts 11, the N opening parts being provided between the two opening parts 11. The N opening parts specifically include one opening part 12A, which is the first-type opening part, and N−1 opening parts 12B, which are the second-type opening parts. The length of one side of each of the opening parts is, for example, about a few hundred nm to a few μm. The opening parts that are provided in the mask 10 are aligned in a line at equal intervals. In the following description, the opening parts 11 may be referred to as end opening parts.

The mask 10 is arranged so as to be opposed to the substrate 1. While the mask 10 and the substrate 1 are typically arranged so as to be parallel to each other, the mask 10 may have an inclination, as an error, with respect to the substrate 1. The mask 10 is formed of, for example, a resist. Specifically, a resist including two layers is layered onto the substrate 1, which is a semiconductor wafer made of, for example, silicon, opening parts are provided in the resist which is in the upper layer by photolithography, the resist which is in the lower layer is made hollow, whereby the mask 10 is manufactured. Note that the resist which is in the lower layer is left as it is so as to be able to support the resist which is in the upper layer. Note that the resist which is in the upper layer may be, for example, ZEP520A manufactured by Zeon Corporation. Further, the resist which is in the lower layer may be, for example, a copolymer methyl methacrylate (MMA). In the cross-sectional views in the lower stages of FIGS. 3A and 3B, the resist which is in the upper layer is shown as the mask 10_1 and the mask 10_2. As shown in the cross-sectional views in the lower stages of FIGS. 3A and 3B, the part from the resist which is in the upper layer to the substrate 1 is made hollow in such a way that a deposition material can move therethrough in a predetermined deposition direction.

In FIGS. 3A and 3B, the direction of the deposition in the first deposition treatment (Step S10) (first direction) is shown by the solid arrows. As shown in FIGS. 3A and 3B, in the first deposition treatment, the superconductor is deposited on the surface of the substrate 1 through the mask 10 in the first direction. This direction is the one obtained by inclining the direction from the mask 10 vertically down to the substrate 1 by a predetermined angle. More specifically, this direction is a direction inclined in a first orientation with respect to a normal line with respect to the mask on a plane (a plane parallel to the paper surface of FIGS. 3A and 3B) defined by the line segment that connects the two opening parts 11 and the normal line with respect to the mask 10 (a line that is vertical to the plane of the mask 10). Specifically, the above direction is a direction that is inclined in the first orientation (the left side on the paper surface in FIG. 4) by a first angle $\theta_1$ as will be shown in FIG. 4 that will be described later.

In the first deposition treatment, the superconductor that has been generated from the deposition source 103 that is located opposite to the substrate 1 with the mask 10 interposed therebetween passes through the opening parts 11, 12A, and 12B of the mask 10 and forms the first superconductor layer 2 on the substrate 1. The number of first superconductor layers 2 corresponds to the number of opening parts of the mask 10. The shapes of the respective first superconductor layers 2 are the same as the shapes of the respective opening parts of the mask 10. That is, the first superconductor layers 2 having patterns in which the patterns of the opening parts of the mask 10 are translated in the direction of the deposition when they are seen from the vertical upper side are formed.

As described above, after the first deposition treatment is carried out, oxidation treatment (Step S20) is carried out next. Accordingly, an oxide film 3, which functions as an insulation film, is formed on the surface of the first superconductor layer 2.

Figure 4:
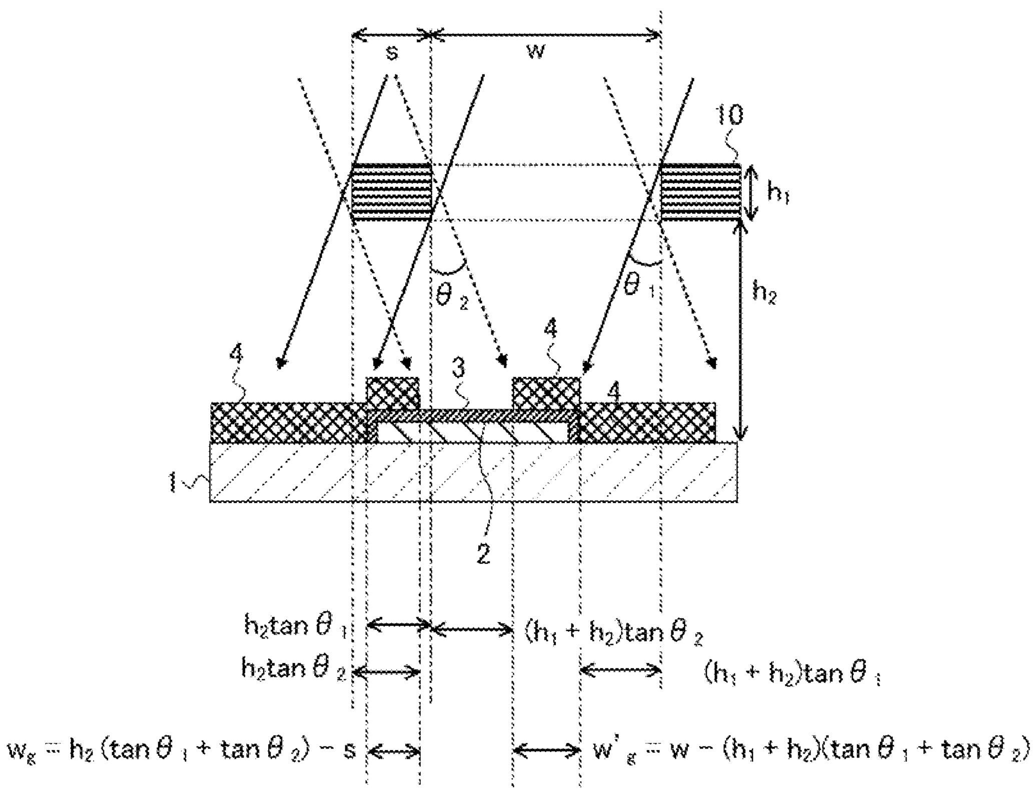
FIG. 4 is a schematic view for geometrically describing the size or the length of each of the components shown in FIGS. 3A and 3B.

After the oxidation treatment is carried out, then the second deposition treatment (Step S30) is carried out. In FIGS. 3A and 3B, the direction of the deposition in the second deposition treatment (second direction) is shown by the dashed arrows. As shown in FIGS. 3A and 3B, in the second deposition treatment, the superconductor is deposited on the surface of the substrate 1 through the mask 10 in the second direction. This direction is a direction obtained by inclining the direction from the mask 10 vertically down to the substrate 1 by a predetermined angle. More specifically, the above direction is as follows. That is, the above direction is a direction that is inclined in a second orientation, which is opposite to the aforementioned first orientation with respect to the normal line with respect to the mask 10 on a plane (a plane that is parallel to the paper surface of FIGS. 3A and 3B) defined by the line segment that connects the two opening parts 11 and the normal line with respect to the mask 10 (the line that is vertical to the plane of the mask 10). Specifically, as shown in FIG. 4 that will be described later, the above direction is a direction inclined in the second orientation (the right side of the paper surface in FIG. 4) by a second angle $\theta_2$.

In the second deposition treatment, the superconductor that has been generated from the deposition source 103 that is located opposite to the substrate 1 with the mask 10 interposed therebetween passes through the opening part 11, 12A, or 12B of the mask 10 and forms the second superconductor layer 4 on the substrate 1. The number of second superconductor layers 4 corresponds to the number of opening parts of the mask 10. The shapes of the respective second superconductor layers 4 are the same as the shapes of the respective opening parts of the mask 10. That is, the second superconductor layers 4 having patterns in which the patterns of the opening parts of the mask 10 are translated in the direction of the deposition when they are seen from the vertical upper side are formed. Since the direction of the second deposition is opposite to the direction of the first deposition, the second superconductor layer 4 is deposited at a location displaced in the direction opposite to the first superconductor layer 2.

The part in which two layers, that is, the first superconductor layer 2 and the second superconductor layer 4, overlap each other, is a Josephson junction having a structure of superconductor-insulator thin film-superconductor. Further, the part where the first superconductor layer 2 does not overlap the second superconductor layer 4 is a conductive wire of the superconductor. As shown in FIGS. 3A and 3B, a connection part 6, which is a conductive wire connected to another circuit on the substrate 1, may be provided on the substrate 1 in advance. In this case, the conductive wire of the superconductor is connected to the connection part 6. In FIGS. 3A and 3B, the connection part 6 is provided below the respective ends of the mask 10. More specifically, the connection part 6 is provided on the substrate 1 so as to include the position where the superconductor derived from the opening part 11 is deposited and not to include the positions where the superconductors derived from the other opening parts (the opening parts 12A and 12B) are deposited. When the connection part 6 is provided in the substrate 1, the first superconductor layer 2 or the second superconductor layer 4 is electrically connected to the connection part 6.

According to the double-angle shadow evaporation that uses the mask 10, specifically, Josephson junctions 5A, 5B, 5C, and 5D are generated.

The Josephson junction 5A, which is a Josephson junction by the aforementioned first-type opening part, is a Josephson junction formed based on the first superconductor layer 2 and the second superconductor layer 4 derived from the opening part 12A.

Further, the Josephson junction 5B, which is a Josephson junction by the aforementioned second-type opening parts, is a Josephson junction formed based on the first superconductor layer 2 and the second superconductor layer 4 derived from the opening part 12B. When the mask does not include the second-type opening parts 12B, like the mask 10_1, the Josephson junction 5B is not generated.

Further, the Josephson junction 5C, which is a Josephson junction by the aforementioned opening parts adjacent to each other, is a Josephson junction formed based on the first superconductor layer and the second superconductor layer derived from two opening parts that are adjacent to each other and are provided in the mask 10.

Further, the Josephson junction 5D is a Josephson junction by the opening part (end opening part) that is provided in the end of the mask 10 among the opening parts of the mask 10. The Josephson junction by the end opening part means a Josephson junction that is formed based on the first superconductor layer 2 and the second superconductor layer 4 derived from one end opening part (the opening part 11). That is, the Josephson junction by the end opening part means a Josephson junction that is formed of a superconductor deposited through one end opening part in the first deposition and a superconductor deposited through the same end opening part in the second deposition.

As will be seen from FIGS. 3A and 3B, with the double-angle shadow evaporation according to this example embodiment, one Josephson junction 5A is generated. Further, N−1 Josephson junctions 5B are generated. Further, N+1 Josephson junctions 5C are generated. Further, two Josephson junctions 5D are generated. These Josephson junctions are connected in series on the substrate 1. That is, a series of arrays in which a plurality of Josephson junctions are connected in series are manufactured. The Josephson junction 5D may not be included in the series of arrays depending on which one of the first superconductor layer 2 and the second superconductor layer 4 another circuit is connected to. For example, in the examples shown in FIGS. 3A and 3B, the right Josephson junction 5D does not form an array since the right connection part 6 is connected to the rightmost first superconductor layer 2 in FIGS. 3A and 3B. When the right connection part 6 is provided in such a way that it is connected to the rightmost second superconductor layer 4 and is not connected to the rightmost first superconductor layer 2, the right Josephson junction 5D also forms an array. Further, when the left connection part 6 is provided so as to be connected to the leftmost second superconductor layer 4, the left Josephson junction 5D does not form an array. Regarding the Josephson junctions 5A, 5B, and 5C, which are Josephson junctions that form an array regardless of the form of the connection part 6, the number of Josephson junctions in the array is 2N+1, which is an odd number. However, in this example embodiment, as will be described later, the number of effective Josephson junctions is 2N, whereby it is possible to make the number of Josephson junctions in the array be substantially an even number.

FIG. 4 is a schematic view for geometrically describing the size or the length of each of the components shown in FIGS. 3A and 3B. In FIG. 4, s denotes a gap between the opening parts that are aligned in the mask 10 at equal intervals. The symbol w denotes the width of a desired opening part (the opening part 11, 12A, or 12B) in the direction in which the plurality of opening parts are aligned. Note that the direction in which the opening parts are aligned means a direction in which the line segment that connects the two opening parts 11 is extended. The symbol $h_1$ denotes the thickness of the opening part of the mask 10. That is, $h_1$ denotes the thickness of the resist in the upper layer. The symbol $h_2$ denotes a distance from the substrate 1 to the opening part. That is, $h_2$ denotes the thickness of the resist in the lower layer. The mask 10 is arranged so as to be parallel to the substrate 1 with a predetermined gap $h_2$ therebetween. The symbol $\theta_1$ denotes the tilt angle of the direction of the deposition (deposition angle) in the first deposition treatment. The symbol $\theta_2$ denotes the tilt angle of the direction of the deposition (deposition angle) in the second deposition treatment. Further, the width of the Josephson junction formed based on the first superconductor layer 2 and the second superconductor layer 4 derived from the two opening parts that are adjacent to each other in the direction in which the opening parts are aligned is denoted by $w_g$. The width of the Josephson junction formed based on the first superconductor layer 2 and the second superconductor layer 4 derived from one opening part in the direction in which the opening parts are aligned is denoted by $w_g'$. As will be seen in FIG. 4, $w_g$ and $w_g'$ are respectively expressed by the following Expressions (1) and (2).

$$w_g = h_2(\tan\theta_1 + \tan\theta_2) - s \tag{1}$$

$$w'_g = w - (h_1 + h_2)(\tan\theta_1 + \tan\theta_2) \tag{2}$$

When the array is used, for example, for a superconducting quantum interference device, the areas of the plurality of respective Josephson junctions that are effectively present in the array are preferably constant. By adjusting the deposition angles $\theta_1$ and $\theta_2$ in such a way that the widths expressed by Expressions (1) and (2) become the same, the areas of the Josephson junctions in the array can be made equal to each other. When the two deposition angles are equal to each other and are symmetrical to each other, the angles at which the areas of the Josephson junctions become equal to each other are angles expressed by the following Expression (3).

$$\theta_{1,2} = \tan^{-1}\left(\frac{w + s}{2h_1 + 4h_2}\right) \tag{3}$$

It can be said that the width expressed by Expression (1) being the same as the width expressed by Expression (2) means that the following condition is established. That is, it can also be said that the width of the Josephson junction based on the superconductor derived from two opening parts that are adjacent to each other, at least one of them being the second-type opening part, is the same as the width of the Josephson junction based on the superconductor derived from the same second-type opening part. Note that these widths may not be completely the same and may include some error. The two deposition angles may not be completely the same and may include some error.

In this example embodiment, as described above, the width of the opening part 12A (first-type opening part) in the mask 10 in the direction in which the opening parts are aligned is a width that satisfies the following condition. That is, this width has such a length that the area of the Josephson junction 5A by the opening part 12A becomes larger than the area of the Josephson junction by the opening parts adjacent to each other. Specifically, the width of the opening part 12A is such a width that the area of the Josephson junction 5A by the opening part 12A becomes a times larger than the area of the Josephson junction by the opening parts adjacent to each other. This can be expressed as shown in the following Expression (4) with reference to Expression (1). That is, the condition that the width (this is denoted by w') of the opening part 12A, which is the first-type opening part, in the direction in which the opening parts are aligned should satisfy can be expressed by the following Expression (4).

$$w' - (h_1 + h_2)(\tan\theta_1 + \tan\theta_2) = \alpha w_g = \alpha h_2(\tan\theta_1 + \tan\theta_2) - \alpha s \leftrightarrow w' = [h_1 + (1+\alpha)h_2](\tan\theta_1 + \tan\theta_2) - \alpha s \quad (4)$$

When the area of the Josephson junction 5A by the opening part 12A (the first-type opening part) is sufficiently larger than the area of the other Josephson junctions, the Josephson junction 5A has a larger critical current value than those in the other Josephson junctions. Therefore, it can be regarded that the Josephson junction 5A is a short-circuited line by the superconductor. Accordingly, the contribution of the Josephson junction 5A to the circuit can be effectively ignored and the influence on the response characteristics of the circuit can be ignored. Specifically, the area is preferably, for example, three or more times larger. When the area of the Josephson junction 5A is three times larger than the area of the other Josephson junctions in the circuit, the contribution of the Josephson junction 5A to the total inductance of the circuit is 14% and the contribution to non-linearity is 4%. Therefore, it can be said that the contribution of the Josephson junction 5A to the circuit can be effectively ignored.

While it is assumed that the widths of the opening parts in the direction in which the opening parts are aligned are constant in the aforementioned description, the method of making the area of a Josephson junction larger than the area of the other Josephson junctions is not limited to the aforementioned method. That is, besides the aforementioned method of increasing the width of the opening part in the direction in which the opening parts are aligned, there is a following method as well. That is, there is a method of increasing the width of the opening part in the direction perpendicular to the direction in which the opening parts are aligned (the width of the opening part in the depth direction). The condition that the area of the Josephson junction 5A is three or more times larger than that of the other Josephson junctions is expressed by the following Expression (5).

$$w' > \left[h_1 + \left(1 + \frac{3}{\beta}\right)h_2\right](\tan\theta_1 + \tan\theta_2) - \frac{3}{\beta}\delta \quad (5)$$

In Expression (5), β denotes a ratio obtained by dividing the width of the opening part 12A in the depth direction by the width of the other opening part (the opening part 12B) in the depth direction. When the widths of the respective opening parts of the mask 10 in the depth direction are the same, β=1 is satisfied. Further, by making the width of the opening part 12A in the depth direction larger than the width of the other opening parts, when the area of the Josephson junction 5A by the opening part 12A is made larger than the area of the other Josephson junctions, β>1 is satisfied.

Figure 5A:
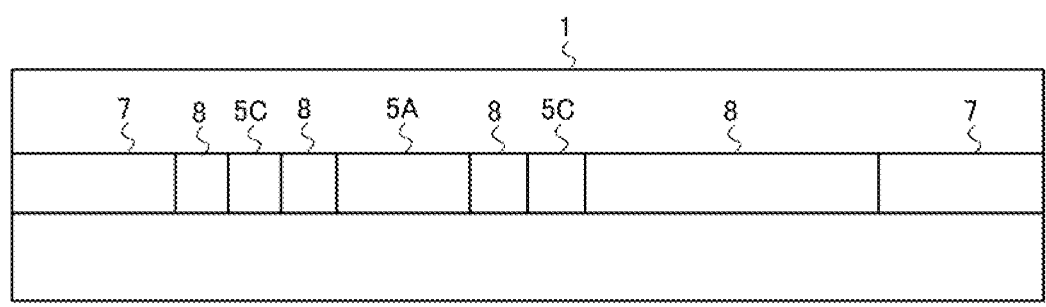
FIG. 5A is a schematic view showing one example of a circuit manufactured when N=1.

As described above, according to the double-angle shadow evaporation that uses the mask 10, it is possible to generate a circuit in which the Josephson junction 5A is disabled. Therefore, when N=1, that is, when only one opening part 12A is provided between the two opening parts 11 as shown in FIG. 3A, the number of effective Josephson junctions that form the array regardless of the form of the connection part 6 becomes two (even number). That is, the Josephson junction 5A is ignored and only two Josephson junctions 5C are present in the array as effective Josephson junctions. FIG. 5A is a schematic view showing one example of a circuit that is manufactured when N=1. FIG. 5A shows a structure of the substrate 1 when it is seen from the vertical upper side. As shown in FIG. 5A, when N=1, a circuit in which one Josephson junction 5A, two Josephson junctions 5C, and conductive wire parts 8 are connected in series is generated between the respective end parts 7 connected to another circuit. However, among the components, the Josephson junction 5A does not effectively contribute to the array.

Figure 5B:
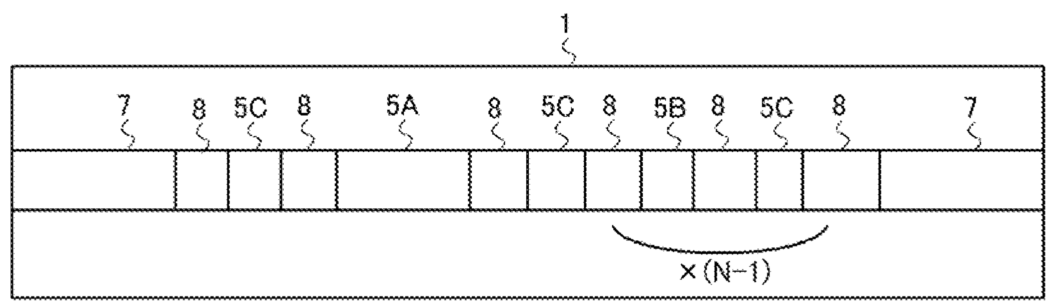
FIG. 5B is a schematic view showing one example of a circuit manufactured when N>1.

Further, when N>1, that is, when the mask 10 includes N−1 opening parts 12B, as shown in FIG. 3B, the number of effective Josephson junctions that form an array regardless of the form of the connection part 6 is 2N (even number). That is, the Josephson junction 5A is ignored and only N+1 Josephson junctions 5C and N−1 Josephson junctions 5B are present in the array as effective Josephson junctions. FIG. 5B is a schematic view showing one example of a circuit manufactured when N>1. FIG. 5B shows a structure of the substrate 1 when it is seen from the vertical upper side. As shown in FIG. 5B, when N>1, a circuit in which one Josephson junctions 5A, N+1 Josephson junctions 5C, N−1 Josephson junctions 5B, and conductive wire parts 8 are connected in series is generated between the respective end parts 7 connected to other circuits. However, among them, the Josephson junction 5A does not effectively contribute to the array.

As described above, when the mask 10 includes the opening part 12B, the Josephson junctions 5B and the Josephson junctions 5C are both included as the effective Josephson junctions. Therefore, in order to make the influence of the Josephson junctions 5B and 5C on the circuits uniform, deposition treatment is carried out in such a way that the areas of the respective Josephson junctions become the same. That is, the deposition treatment is carried out at the deposition angles that satisfy the aforementioned Expression (3).

On the other hand, if the mask includes only N opening parts 12B between the two opening parts 11 and do not include the opening part 12A, the number of effective Josephson junctions ends up being an odd number. In this example embodiment, due to the presence of the opening part 12A, the number of effective Josephson junctions may be an even number.

As discussed above, with the double-angle shadow evaporation according to this example embodiment, it is possible to provide a circuit in which a substantially even number of Josephson junctions are aligned in series by a simple method that uses a single type of mask. Further, by adjusting the deposition angles, the area of the Josephson junction that is effectively present can be made close to uniform.

Figure 6A:
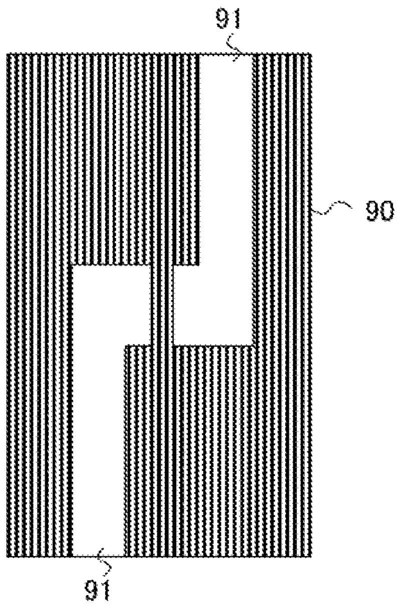
FIG. 6A is a schematic view for describing a double-angle shadow evaporation in which a shadow occurs.
Figure 6B:
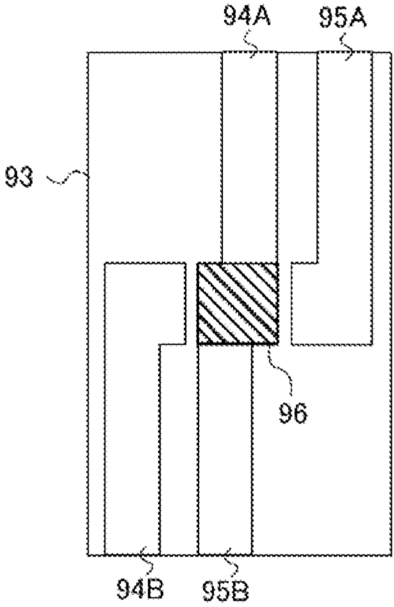
FIG. 6B is a schematic view for describing a double-angle shadow evaporation in which a shadow occurs.

Further, one of advantages in the double-angle shadow evaporation according to this example embodiment is that an independent deposition part (so-called shadow) that does not contribute to a Josephson junction is not generated. Here, the explanation of shadow will be added with reference to a drawing. As shown in FIG. 6A, when deposition is performed twice by the double-angle shadow evaporation using a mask 90 in which two L-shaped opening parts 91 are arranged so as to be point-symmetrical to each other so that the openings of the opening parts 91 in the short direction are opposed to each other, the deposition pattern as shown in FIG. 6B is formed on a substrate 93. It is assumed that deposition angles that are symmetrical to each other are used in two deposition processes. In this case, as shown in FIG. 6B, deposition patterns 94A and 94B are formed by the first deposition and deposition patterns 95A and 95B are formed by the second deposition. Note that the deposition pattern 94A is a deposition pattern derived from one of the two opening parts 91 and the deposition pattern 94B is a deposition pattern derived from the other one of the two opening parts 91. Likewise, the deposition pattern 95A is a deposition pattern derived from one of the two opening parts 91 and the deposition pattern 95B is a deposition pattern that is derived from the other one of the opening parts 91. The deposition pattern 94A and the deposition pattern 94B partially overlap each other as shown by the hatching in FIG. 6B. Therefore, by oxidizing the surface of the deposition pattern before the second deposition, a Josephson junction 96 can be formed. However, the deposition pattern 94B and the deposition pattern 95A are independent deposition parts that do not contribute to the Josephson junction 96 and are not connected to other circuits or ground. That is, the deposition pattern 94B and the deposition pattern 95A are shadows. Therefore, it is possible that the deposition pattern 94B and the deposition pattern 95A may cause electromagnetic noise as they do not have a fixed potential.

On the other hand, in this example embodiment, the aforementioned shadow is not generated. It is therefore possible to prevent electromagnetic noise from occurring.

Incidentally, as described above, the Josephson junction 5D may or may not be included in the array depending on how the array is connected to the other circuits. When the Josephson junction 5D is included in the array, the Josephson junction 5D may have a sufficiently large size so that it becomes a non-effective Josephson junction, like the Josephson junction 5A.

For example, in the examples shown in FIGS. 3A and 3B, the array is electrically connected to the connection part 6 on the substrate 1 in the first superconductor layer 2 deposited by the first deposition treatment (more specifically, the leftmost first superconductor layer 2 in FIGS. 3A and 3B). Therefore, the Josephson junction 5D that is located on the left side of FIGS. 3A and 3B is a circuit element included in the array. Therefore, in order to reduce the influence of the Josephson junction 5D, the opening part 11 that corresponds to this Josephson junction 5D (more specifically, the opening part 11 on the left side in FIGS. 3A and 3B) may have a sufficiently large size. That is, by making the opening of the opening part 11 have a sufficiently large size, the area of the Josephson junction 5D may be sufficiently larger than the area of the Josephson junction by the opening parts adjacent to each other. Specifically, the area is preferably three or more times larger. When the area of the Josephson junction 5D is three times larger than the area of the other Josephson junctions in the circuit, the contribution of the Josephson junction 5D to the total inductance of the circuit is 14% and the contribution to non-linearity is 4%. It can therefore be said that the contribution of the Josephson junction 5D to the circuit can be effectively ignored.

Regarding the condition that the area of the Josephson junction 5D with respect to the other Josephson junctions becomes three or more times, the condition that the width (this is denoted by w") of the opening part 11 in the direction in which the opening parts are aligned should satisfy is expressed by the following Expression (6). Note that, in Expression (6), β' denotes a ratio obtained by dividing the width of the opening part 11 in the depth direction by the width of the other opening part (the opening part 12B) in the depth direction.

$$w'' > \left[h_1 + \left(1 + \frac{3}{\beta'}\right)h_2\right](\tan\theta_1 + \tan\theta_2) - \frac{3}{\beta'}s \tag{6}$$

As described above, the mask 10 whose size of the opening parts 11 has been adjusted may be used. In other words, the following mask 10 may be used. That is, when another circuit is connected to the first connecting superconductor layer, the width of the first-end opening part in the direction in which the opening parts are aligned satisfies the following condition. That is, this width has such a length that the area of the Josephson junction based on the superconductor derived from the first-end opening part becomes larger than the area of the Josephson junction based on the superconductor derived from the two opening parts that are adjacent to each other. Note that the first connecting superconductor layer means the first superconductor layer 2 that is located at the end in the direction in which the pattern of the first superconductor layer 2 is displaced (left in FIGS. 3A and 3B) with respect to the opening parts of the mask 10. Further, the first-end opening part means one of the two opening parts 11 of the mask 10 that is provided at the end of the mask 10 in the direction in which the above pattern is displaced (left opening part 11 in FIGS. 3A and 3B).

Further, when another circuit is connected to the second connecting superconductor layer, the width of the second-end opening part in the direction in which the opening parts are aligned satisfies the following condition. That is, this width has such a length that the area of the Josephson junction based on the superconductor derived from the second-end opening part becomes larger than the area of the Josephson junction based on the superconductor derived from two opening parts that are adjacent to each other. Note that the second connecting superconductor layer means the second superconductor layer 4 that is located at the end in the direction in which the pattern of the second superconductor layer 4 is displaced with respect to the opening part of the mask 10 (right in FIGS. 3A and 3B). Further, the second-end opening part means one of the two opening parts 11 of the mask 10 that is provided at the end of the mask 10 in the direction in which the above pattern is displaced (right opening part 11 in FIGS. 3A and 3B).

In the first-end opening part and the second-end opening part, the width of the depth direction may be the same as or larger than the second-type opening part (the opening part 12B).

Now, a case in which the width of the opening part 12A and the opening part 11 in the depth direction is changed from the width of the opening part 12B in the depth direction (that is, β≠1 and β'≠1) will be discussed. In this case, when the opening part 12A and the opening part 11 are arranged so as to be adjacent to each other, the width of the Josephson junction formed based on the superconductor derived from these opening parts in the depth direction is as follows. That is, this width is min(β,β') times larger than the width of the Josephson junction formed based on the superconductor derived from the opening parts 12B that are adjacent to each other in the depth direction. The symbol min(β,β') denotes a value of β or β' which is smaller than the other one. In this example embodiment, it is required that the area of all the Josephson junctions formed based on the superconductor derived from opening parts that are adjacent to each other be the same as the area of the Josephson junction formed based on the superconductor derived from the opening part 12B. Therefore, it is required to avoid an alignment of opening parts that would produce a Josephson junction having an area min(β,β') time larger (where β≠1 and β'≠1). Therefore, in this example embodiment, when min(β,β')≠1 and N>1, a mask 10 in which the opening part 12A and the opening part 11 that should have a sufficiently large size are not adjacent to each other is used. On the other hand, when the width of the opening part in the depth direction is constant, there is no such limitation on the alignment of the opening parts.

While the mask 10 includes only one opening part 12A in the aforementioned description which refer to FIGS. 3A and 3B, the number of opening parts 12A may be an odd number larger than 1. In this case as well, an array having an even number of effective Josephson junctions can be formed. When the number of opening parts 12A is k, in a case in which N=k, N+1 Josephson junctions 5C based on the superconductor derived from two opening parts that are adjacent to each other and k Josephson junctions 5A based on the superconductor derived from the opening part 12A are manufactured. Therefore, the number of effective Josephson junctions is N+1=k+1. Further, when N>k, N+1 Josephson junctions 5C, k Josephson junctions 5A, and N-k Josephson junctions 5B which are based on a superconductor derived from the opening part 12B are manufactured. Therefore, the number of effective Josephson junctions is 2N+1-k. Therefore, when k is an odd number, the number of effective Josephson junctions becomes an even number in any case. Even when the number of opening parts 12A is an odd number larger than 1, the conditions from Expressions (1) to (6) are similar to the case in which the number of opening parts 12A is one. However, when β>1 is satisfied regarding the width of the opening part 12A in the depth direction, if the opening parts 12A are aligned so as to be adjacent to each other, the width of the Josephson junction derived from these opening parts in the depth direction is as follows. That is, this width is 13 times larger than the width of the Josephson junction formed based on the superconductor derived from the opening parts 12B that are adjacent to each other in the depth direction. In this example embodiment, it is required that the area of all the Josephson junctions formed based on the superconductor derived from opening parts that are adjacent to each other be the same as the area of the Josephson junction formed based on the superconductor derived from the opening part 12B. Therefore, when the number of opening parts 12A is an odd number larger than 1, and β>1 and N>1 are satisfied, a mask 10 in which the opening parts 12A do not adjacent to each other is used. On the other hand, when the width of the opening parts in the depth direction is constant, there is no such a limitation on the alignment of the opening parts.

Figure 7A:
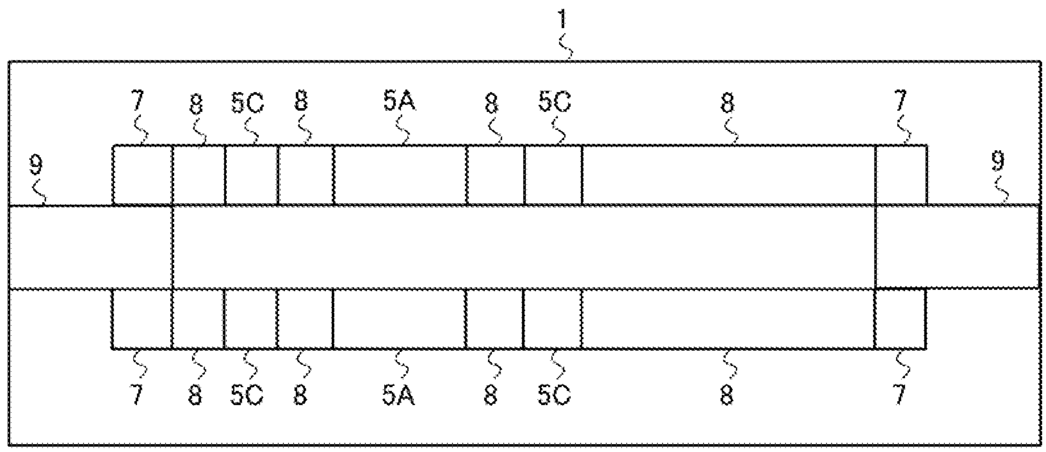
FIG. 7A is a schematic view showing one example of a looped circuit manufactured when N=1.
Figure 7B:
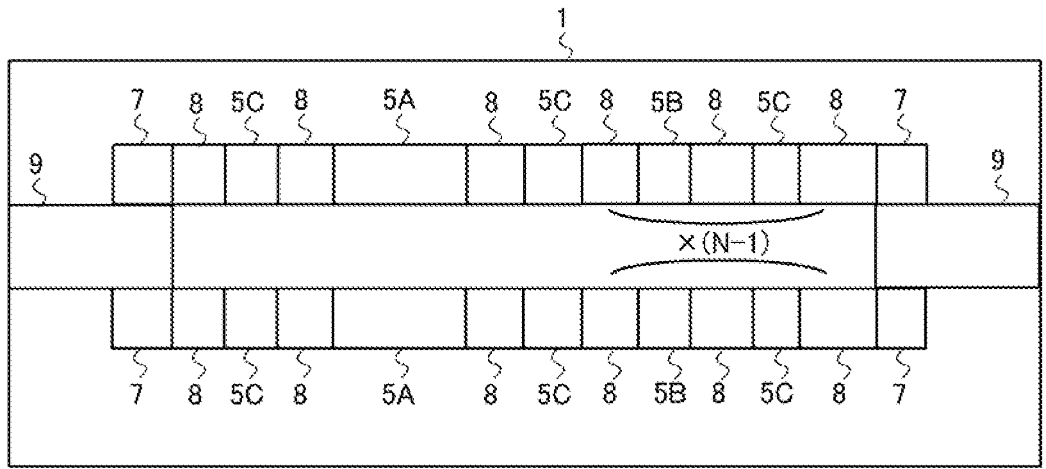
FIG. 7B is a schematic view showing one example of a looped circuit manufactured when N>1.

Incidentally, a desired circuit may be manufactured using an array obtained by the aforementioned double-angle shadow evaporation. For example, with the aforementioned double-angle shadow evaporation, two circuits in which Josephson junctions are connected in series may be manufactured and these two circuits may be connected to each other in a loop shape, whereby the superconducting quantum interference device may be manufactured. That is, a closed-loop circuit may be formed by connecting two arrays. FIG. 7A is a schematic view showing one example of a circuit in which two arrays obtained by using the mask 10 when N=1 are connected in a loop, and FIG. 7B is a schematic view showing one example of a circuit in which two arrays obtained by using the mask 10 when N>1 are connected in a loop. These circuits are manufactured by connecting two arrays using the other circuits 9 on the substrate 1, as shown in, for example, FIG. 7A or 7B. The connection of the two arrays is not limited to the above method and may be achieved by another method. For example, two arrays may be connected by connecting the opening of the opening part 11 for one array and the opening of the opening part 11 for the other array and manufacturing the Josephson junction based on the superconductor derived from this opening part.

Specific Examples

Next, specific examples of the double-angle shadow evaporation using the mask 10 will be described. As described above, it is assumed that the opening parts of the mask 10 are aligned at equal intervals s and there are one opening part 12A (the length w' thereof in the direction in which the opening parts are aligned) and N−1 opening parts 12B (the length w thereof in the direction in which the opening parts are aligned, where w<w') between the two opening parts 11. The double-angle shadow evaporation is carried out at two kinds of deposition angles using this mask 10. Note that two kinds of deposition angles are angles that satisfy the condition (Expression (4)) that the area of the Josephson junction based on the superconductor derived from the opening part 12A is sufficiently larger than the area of the Josephson junction based on the superconductor derived from two opening parts that are adjacent to each other. Further, when N>1, two kinds of deposition angles are further angles that satisfy the condition (Expression (3)) that the area of the Josephson junction based on the superconductor derived from two opening parts that are adjacent to each other becomes equal to the area of the Josephson junction based on the superconductor derived from the opening part 12B.

It is assumed here that w=0.72 μm, w'=2.16 μm, and s=0.2 μm. It is further assumed, regarding the other variables shown in FIG. 4, that $h_1$=300 nm and $h_2$=600 nm. It is further assumed that N=2. It is further assumed that the width of each opening part in the depth direction is constant. That is, with regard to the aforementioned β and β', it is assumed that β=β'=1. When the two kinds of deposition angles are the same, this angle is 17 degrees from Expression (3). Then, the width of the Josephson junction based on the superconductor derived from two opening parts that are adjacent to each other in the direction in which the opening parts are aligned and the width of the Josephson junction based on the superconductor derived from the opening part 12B in the direction in which the opening parts are aligned are 170 nm. Further, the width of the Josephson junction based on the superconductor derived from the opening part 12A in the direction in which the opening parts are aligned is 1600 nm from Expression (2). That is, the Josephson junction based on the superconductor derived from the opening part 12A is about ten times larger than the other Josephson junctions. Therefore, the contribution of the Josephson junction can be effectively ignored. Therefore, it can be regarded that the circuit generated using this mask is an array of 2N=4 Josephson junctions having the equal area. Further, when the width w" of the opening part 11 in the direction in which the opening parts are aligned is 1060 nm, the width of the Josephson junction based on the superconductor derived from the opening part 11 in the direction in which the opening parts are aligned is 510 nm from Expression (2). Therefore, since this Josephson junction is about three times larger than the other Josephson junctions, the contribution to the circuit can be effectively ignored.

When N=1, the opening part 12B is not present in the mask 10. Therefore, the condition (Expression (3)) that the area of the Josephson junction based on the superconductor derived from two opening parts that are adjacent to each other becomes the same as the area of the Josephson junction based on the superconductor derived from the opening part 12B is not necessary. In this case, the deposition angles $\theta_1$ and $\theta_2$ are free parameters. Therefore, it is sufficient that the condition (Expression (5)) that the area of the Josephson junction based on the superconductor derived from the opening part 12A is sufficiently larger than the area of the Josephson junction based on the superconductor derived from two opening parts that are adjacent to each other be satisfied. Depending on the position of the connection part 6, it is further required that the condition (Expression (6)) that the area of the Josephson junction based on the superconductor derived from the opening part 11 is sufficiently larger than the area of the Josephson junction based on the superconductor derived from two opening parts that are adjacent to each other be satisfied.

The example embodiment has been described above. According to the double-angle shadow evaporation as described above, the following superconducting circuit including a substrate, first superconductor layers, and second superconductor layers is manufactured. The first superconductor layers are arranged on the substrate in a line shape in the predetermined direction with a predetermined gap therebetween, and the surface of the first superconductor layers is covered with an oxide film. The second superconductor layers are arranged on the substrate and the first superconductor layers in a line shape in the predetermined direction with a predetermined gap therebetween in such a way that the pattern in which the second superconductor layers are arranged is displaced from the pattern in which the first superconductor layers are arranged. Then, this superconducting circuit includes a plurality of Josephson junctions in which the first superconductor layer overlaps the second superconductor layer via the oxide film. Further, of these plurality of Josephson junctions, the Josephson junctions except for the Josephson junctions at the respective ends are classified into first-type Josephson junctions and second-type Josephson junctions. The size of the area of the first-type Josephson junctions is different from that of the second-type Josephson junctions. The area of the first-type Josephson junctions is larger than that of the second-type Josephson junctions. Further, the number of first-type Josephson junctions is an odd number and the total number of first-type Josephson junctions and second-type Josephson junctions is an odd number as well. According to the above configuration, some Josephson junctions, that is, the first-type Josephson junctions, can be non-effective Josephson junctions. That is, according to the superconducting circuit, the number of effective Josephson junctions may be an odd number.

Note that the present invention is not limited to the aforementioned example embodiment and may be changed as appropriate without departing from the spirit of the present invention. For example, the aforementioned superconducting circuit may be used for various types of circuits. The aforementioned superconducting circuit may be used for a superconducting quantum interference device or may be used for a nonlinear resonator that uses this superconducting quantum interference device. Further, an oscillator that uses this nonlinear resonator may be manufactured or a phase detector that uses this oscillator may be manufactured. Further, a quantum computer in which a plurality of nonlinear resonators are connected to each other may be manufactured.

Further, the whole or part of the example embodiment disclosed above can be described as, but not limited to, the following supplementary notes.

(Supplementary Note 1)

A circuit manufacturing method by deposition comprising:

performing first deposition for forming a first superconductor layer by depositing a superconductor on a substrate through a mask in a first direction;

oxidizing a surface of the first superconductor layer, thereby forming an oxide film;

performing second deposition for forming a second superconductor layer by depositing the superconductor on the substrate through the mask in a second direction, the first superconductor layer and the oxide film being formed in the substrate; and generating a circuit in which Josephson junctions are aligned, each of the Josephson junctions including the first superconductor layer and the second superconductor layer that overlap each other via the oxide film, wherein the mask includes two opening parts provided at the respective ends of the mask and an odd number of first-type opening parts provided on a line segment that connects the two opening parts, the odd number of first-type opening parts being provided between the two opening parts, the first direction is a direction that is inclined in a first orientation with respect to a normal line with respect to the mask on a plane defined by the line segment and the normal line with respect to the mask, the second direction is a direction that is inclined in a second orientation opposite to the first orientation with respect to the normal line on the plane, and the width of the first-type opening part in the direction in which the line segment is extended has such a length that the area of a Josephson junction formed based on the first superconductor layer and the second superconductor layer derived from the first-type opening part becomes larger than the area of a Josephson junction formed based on the first superconductor layer and the second superconductor layer derived from the two opening parts that are adjacent to each other.

(Supplementary Note 2)

The circuit manufacturing method according to Supplementary Note 1, wherein the mask further includes one or more second-type opening parts whose width in the direction in which the line segment is extended is shorter than that of the first-type opening part, the one or more second-type opening parts being provided on the line segment and between the two opening parts, and the width of the first-type opening part in the direction in which the line segment is extended has such a length that the area of the Josephson junction formed based on the first superconductor layer and the second superconductor layer derived from the first-type opening part becomes larger than the area of the Josephson junction formed based on the first superconductor layer and the second superconductor layer derived from the two opening parts that are adjacent to each other and the area of the Josephson junction formed based on the first superconductor layer and the second superconductor layer derived from the same second-type opening part.

(Supplementary Note 3)

The circuit manufacturing method according to Supplementary Note 2, wherein the first direction is a direction that is inclined in the first orientation by a first angle with respect to the normal line, the second direction is a direction that is inclined in the second orientation by a second angle with respect to the normal line, the first angle and the second angle are equal to each other, and the width of the Josephson junction formed based on the first superconductor layer and the second superconductor layer derived from the two opening parts that are adjacent to each other, at least one of the opening parts being the second-type opening part, in the direction in which the line segment is extended is the same as the width of the Josephson junction formed based on the first superconductor layer and the second superconductor layer derived from the same second-type opening part in the direction in which the line segment is extended.

(Supplementary Note 4)

The circuit manufacturing method according to any one of Supplementary Notes 1 to 3, wherein the width of the first-type opening part in the direction in which the line segment is extended has such a length that the area of the Josephson junction formed based on the first superconductor layer and the second superconductor layer derived from the first-type opening part becomes three or more times larger than the area of the Josephson junction formed based on the first superconductor layer and the second superconductor layer derived from the two opening parts that are adjacent to each other.

(Supplementary Note 5)

The circuit manufacturing method according to any one of Supplementary Notes 1 to 4, wherein, when another circuit is connected to a first connecting superconductor layer, which is the first superconductor layer that is present in an end in a direction in which the pattern of the first superconductor layer is displaced with respect to the opening part, the width of a first-end opening part, which is one of the two opening parts provided at the respective ends of the mask that is provided in the direction in which the pattern of the first superconductor layer is displaced in the direction in which the line segment is extended has such a length that the area of the Josephson junction formed based on the first superconductor layer and the second superconductor layer derived from the first-end opening part becomes larger than the area of the Josephson junction formed based on the first superconductor layer and the second superconductor layer derived from the two opening parts that are adjacent to each other.

(Supplementary Note 6)

The circuit manufacturing method according to any one of Supplementary Notes 1 to 5, wherein, when another circuit is connected to a second connecting superconductor layer, which is the second superconductor layer that is present in an end in a direction in which the pattern of the second superconductor layer is displaced with respect to the opening part, the width of a second-end opening part, which is one of the two opening parts provided at the respective ends of the mask that is provided in the direction in which the pattern of the second superconductor layer is displaced in the direction in which the line segment is extended has such a length that the area of the Josephson junction formed based on the first superconductor layer and the second superconductor layer derived from the second-end opening part becomes larger than the area of the Josephson junction formed based on the first superconductor layer and the second superconductor layer derived from the two opening parts that are adjacent to each other.

(Supplementary Note 7)

The circuit manufacturing method according to Supplementary Note 2, wherein the width of the first-type opening part in the direction that is perpendicular to the direction in which the line segment is extended is larger than the width of the second-type opening part in the direction that is perpendicular to the direction in which the line segment is extended.

(Supplementary Note 8)

The circuit manufacturing method according to Supplementary Note 5 that depends from Supplementary Note 2, wherein the width of the first-end opening part in the direction that is perpendicular to the direction in which the line segment is extended is larger than the width of the second-type opening part in the direction that is perpendicular to the direction in which the line segment is extended.

(Supplementary Note 9)

The circuit manufacturing method according to Supplementary Note 6 that depends from Supplementary Note 2, wherein the width of the second-end opening part in the direction that is perpendicular to the direction in which the line segment is extended is larger than the width of the second-type opening part in the direction that is perpendicular to the direction in which the line segment is extended.

(Supplementary Note 10)

The circuit manufacturing method according to any one of Supplementary Notes 1 to 9, wherein the number of first-type opening parts is one.

(Supplementary Note 11)

A circuit manufacturing method comprising:

manufacturing two circuits by the circuit manufacturing method according to any one of Supplementary Notes 1 to 10, Josephson junctions being connected in series in each of the two circuits, wherein the two circuits are connected to each other in a loop shape.

(Supplementary Note 12)

A superconducting circuit comprising:

a substrate;

first superconductor layers arranged on the substrate in a line shape in a predetermined direction with a predetermined gap therebetween, a surface of each of the first superconductor layers being covered with an oxide film;

second superconductor layers arranged on the substrate and the first superconductor layers in a line shape in the predetermined direction with the predetermined gap therebetween, the pattern in which the second superconductor layers are arranged being displaced from the pattern in which the first superconductor layers are arranged, wherein of a plurality of Josephson junctions, which indicate parts where the first superconductor layers and the second superconductor layers overlap each other via the oxide film, Josephson junctions except for the Josephson junctions at the respective ends of the substrate include first-type Josephson junctions and second-type Josephson junctions, the area of the first-type Josephson junctions is larger than the area of the second-type Josephson junctions, and the number of first-type Josephson junctions is an odd number and the total number of first-type Josephson junctions and second-type Josephson junctions is an odd number as well.

While the present invention has been described above with reference to the example embodiment, the present invention is not limited to them. Various changes that may be understood by those skilled in the art can be made to the configurations and the details of the present invention within the scope of the invention.

This application is based upon and claims the benefit of priority from Japanese Patent Application No. 2019-121065, filed on Jun. 28, 2019, the disclosure of which is incorporated herein in its entirety by reference.

REFERENCE SIGNS LIST

1 Substrate
2 First Superconductor Layer
3 Oxide Film
4 Second Superconductor Layer
5 Josephson Junction
6 Connection Part
7 End Part
8 Conductive Wire Part
9 Another Circuit
10 Mask
11 Opening Part
12 Opening Part
90 Mask
91 Opening Part
93 Substrate
94 Deposition Pattern
95 Deposition Pattern
96 Josephson Junction
100 Double-Angle Shadow Evaporation Apparatus
101 Chamber
102 Substrate Holder
103 Deposition Source

What is claimed is:

1. A superconducting circuit comprising:

a substrate;

first superconductor layers arranged on the substrate in a line shape in a predetermined direction with a predetermined gap therebetween, a surface of each of the first superconductor layers being covered with an oxide film; and second superconductor layers arranged on the substrate and the first superconductor layers in a line shape in the predetermined direction with the predetermined gap therebetween, the pattern in which the second superconductor layers are arranged being displaced from the pattern in which the first superconductor layers are arranged, wherein the superconducting circuit include a plurality of Josephson junctions formed by parts where the first superconductor layers and the second superconductor layers overlap each other via the oxide film, the plurality of Josephson junctions include:

a first Josephson junction having a first area;

a second Josephson junction having a second area;

at least one third Josephson junction each having a third area and between the first Josephson junction and the second Josephson junction; and a plurality of fourth Josephson junctions each having a fourth area and between the first Josephson junction and the second Josephson junction, the third area is larger than the fourth area, the number of the at least one third Josephson junction each having the third area is an odd number and the total number of the at least one third Josephson junction having the third area and the plurality of fourth Josephson junctions each having the fourth area is an odd number as well, and the superconducting circuit includes a first series circuit in which the at least one third Josephson junction each having the third area and the plurality of fourth Josephson junctions each having the fourth area are connected in series.

2. The superconducting circuit according to claim 1, further comprising:

third superconductor layers arranged on the substrate in a line shape in the predetermined direction with the predetermined gap therebetween, a surface of each of the third superconductor layers being covered with an oxide film; and fourth superconductor layers arranged on the substrate and the third superconductor layers in a line shape in the predetermined direction with the predetermined gap therebetween, the pattern in which the fourth superconductor layers are arranged being displaced from the pattern in which the third superconductor layers are arranged, wherein the superconducting circuit further include a plurality of Josephson junctions formed by parts where the third superconductor layers and the fourth superconductor layers overlap each other via the oxide film, the plurality of Josephson junctions formed by parts where the third superconductor layers and the fourth superconductor layers overlap each other via the oxide film include:

a fifth Josephson junction having a fifth area;

a sixth Josephson junction having a sixth area;

at least one seventh Josephson junction each having a seventh area and between the fifth Josephson junction and the sixth Josephson junction; and a plurality of eighth Josephson junctions each having an eighth area and between the fifth Josephson junction and the sixth Josephson junction, the seventh area is larger than the eighth area, the number of the at least one seventh Josephson junction each having the seventh area is an odd number and the total number of the at least one seventh Josephson junction having the seventh area and the plurality of eighth Josephson junctions each having the eighth area is an odd number as well, the superconducting circuit includes a second series circuit in which the at least one seventh Josephson junction each having the seventh area and the plurality of eighth Josephson junctions each having the eighth area are connected in series, and the first series circuit and the second series circuit are connected to each other in a loop shape.

3. The superconducting circuit according to claim 1, wherein the third area is three or more times larger than the fourth area.

* * * * *